(12) United States Patent  
Baker

(10) Patent No.: US 9,595,927 B2  
(45) Date of Patent: Mar. 14, 2017

(54) BIAS ADJUSTMENT CIRCUITRY FOR BALANCED AMPLIFIERS

(71) Applicant: Cree, Inc., Durham, NC (US)

(72) Inventor: Kyle Baker, Raleigh, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 14/461,905

(22) Filed: Aug. 18, 2014

(65) Prior Publication Data

US 2016/0049907 A1 Feb. 18, 2016

(51) Int. Cl.
| | |
|---|---|
| H03F 3/68 | (2006.01) |
| H03F 1/02 | (2006.01) |
| H03F 1/56 | (2006.01) |
| H03F 3/19 | (2006.01) |
| H03F 3/195 | (2006.01) |
| H04B 1/04 | (2006.01) |
| H03F 3/60 | (2006.01) |

(52) U.S. Cl.
CPC ............. *H03F 1/56* (2013.01); *H03F 1/0261* (2013.01); *H03F 3/195* (2013.01); *H03F 3/602* (2013.01); *H04B 1/0475* (2013.01); *H03F 2200/192* (2013.01); *H03F 2200/198* (2013.01); *H03F 2200/204* (2013.01); *H03F 2200/222* (2013.01); *H03F 2200/24* (2013.01); *H03F 2200/387* (2013.01); *H03F 2200/408* (2013.01); *H03F 2200/451* (2013.01); *H03F 2200/555* (2013.01)

(58) Field of Classification Search
USPC .................... 330/295, 124 R, 84, 286, 53
See application file for complete search history.

(56) References Cited

U.S. PATENT DOCUMENTS

| | | | |
|---|---|---|---|
| 4,729,129 A | 3/1988 | Koerner | |
| 7,358,807 B2 | 4/2008 | Scuderi et al. | |
| 8,180,306 B2 | 5/2012 | Villain et al. | |
| 8,847,681 B2 * | 9/2014 | Namerikawa | H01P 5/12 330/126 |
| 2002/0186079 A1 * | 12/2002 | Kobayashi | H03F 1/0288 330/124 R |

OTHER PUBLICATIONS

Carrara, Francesco, et al., "A Methodology for Fast VSWR Protection Implemented in a Monolithic 3-W 55% PAE RF CMOS Power Amplifier," IEEE Journal of Solid-State Circuits, vol. 43, Issue 9, Sep. 2008, IEEE, pp. 2057-2066.

(Continued)

*Primary Examiner* — Hieu Nguyen

(74) *Attorney, Agent, or Firm* — Anthony J. Josephson

(57) ABSTRACT

Circuitry includes a balanced amplifier and bias adjustment circuitry. The bias adjustment circuitry is coupled to the balanced amplifier and is configured to measure an RF termination voltage across an output termination impedance of the balanced amplifier and adjust a bias voltage supplied to the balanced amplifier based on the RF termination voltage. Notably, the RF termination voltage is proportional to a voltage standing wave ratio (VSWR) of the balanced amplifier, and thus enables an accurate measurement thereof. By using the RF termination voltage to adjust a bias voltage supplied to the balanced amplifier, overvoltage and/or thermally stressing conditions of the balanced amplifier as a result of high VSWR may be avoided while simultaneously avoiding the need for large or expensive isolation circuitry.

24 Claims, 6 Drawing Sheets

(56) References Cited

OTHER PUBLICATIONS

Hu, Q.Z., et al., "A SiGe Power Amplifier with Power Detector and VSWR Protection for TD-SCDMA Application," Proceedings of the International Conference on Mixed Design of Integrated Circuits and System, Jun. 22-24, 2006, Gdynia, Poland, Technical University of Lodz Department of Microelectronics & Computer Science, pp. 214-217.

Karoui, Walid, et al., "A protection circuit for HBT RF power amplifier under load mismatch conditions," 2008 Joint 6th International IEEE Northeast Workshop on Circuits and Systems and TAISA Conference, Jun. 22-25, 2008, Montreal, Québec, IEEE, pp. 241-244.

Scuderi, Angelo, et al., "A VSWR-Protected Silicon Bipolar RF Power Amplifier With Soft-Slope Power Control," IEEE Journal of Solid-State Circuits, vol. 40, Issue 3, Mar. 2005, IEEE, pp. 611-621.

Van Bezooijen, André, et al., "Power Amplifier Protection by Adaptive Output Power Control," IEEE Journal of Solid-State Circuits, vol. 42, Issue 9, Sep. 2007, IEEE, pp. 1834-1841.

Van Heijningen, M., et al., "VSWR-protected 90 W L-band AlGaN/GaN Power Amplifier," Proceedings of the IEEE MTT-S International Microwave Symposium (IMS), Jun. 1-6, 2014, Tampa, Florida, IEEE, 3 pages.

Zimmerman, Niklas, et al., "An Over-Voltage Protection Circuit for CMOS Power Amplifiers," 15th IEEE International Conference on Electronics, Circuits, and Systems, Aug. 31-Sep. 3, 2008, St. Julien's, Newfoundland, IEEE, pp. 161-164.

* cited by examiner

BIAS ADJUSTMENT CIRCUITRY FOR BALANCED AMPLIFIERS

FIELD OF THE DISCLOSURE

The present disclosure relates to bias circuitry for balanced amplifiers.

BACKGROUND

Balanced amplifiers are widely used in the amplification of radio frequency (RF) signals due to their exceptional performance in many practical situations. Specifically, balanced amplifiers often exhibit, good input and output return losses, and better stability when compared to single-ended amplifiers. An exemplary conventional balanced amplifier 10 is shown in FIG. 1. The conventional balanced amplifier 10 includes an RF input node 12, an RF output node 14, an input termination impedance 16, an output termination impedance 18, a first amplifying device 20, a second amplifying device 22, an input quadrature coupler 24, and an output quadrature coupler 26. The input quadrature coupler 24 includes a first input node 28 coupled to the input termination impedance 16, a second input node 30 coupled to the RF input node 12, a first output node 32 coupled to an input of the first amplifying device 20, and a second output node 34 coupled to an input of the second amplifying device 22. The output quadrature coupler 26 includes a first input node 36 coupled to an output of the first amplifying device 20, a second input node 38 coupled to an output of the second amplifying device 22, a first output node 40 coupled to the RF output node 14, and a second output node 42 coupled to the output termination impedance 18.

In operation, the conventional balanced amplifier 10 is configured to receive an RF input signal RF_IN at the RF input node 12 and produce an amplified RF output signal RF_OUT at the RF output node 14. Specifically, the conventional balanced amplifier 10 is configured to receive an RF input signal RF_IN with a phase angle of zero degrees at the RF input node 12. As the RF input signal RF_IN enters the input quadrature coupler 24, the signal is split into an in-phase portion and a quadrature portion. The in-phase portion of the RF input signal RF_IN is equal to the RF input signal RF_IN over the square root of two (0.707 multiplied by the RF input signal RF_IN) at a phase angle of zero degrees, while the quadrature portion of the RF input signal RF_IN is equal to the RF input signal RF_IN over the square root of two (0.707 multiplied by the RF input signal RF_IN) at a phase angle of −90 degrees. The in-phase portion of the RF input signal RF_IN is delivered to and amplified by the second amplifying device 22, while the quadrature portion of the RF input signal RF_IN is delivered to and amplified by the first amplifying device 20. The resulting amplified in-phase portion of the RF input signal RF_IN is delivered to the second input node 38 of the output quadrature coupler 26, while the resulting amplified quadrature portion of the RF input signal RF_IN is delivered to the first input node 36 of the output quadrature coupler 26.

The output quadrature coupler 26 shifts the amplified in-phase portion of the RF input signal RF_IN at the second input node 38 by −90 degrees and delivers both the amplified and phase-shifted in-phase portion of the RF input signal RF_IN and the amplified quadrature portion of the RF input signal RF_IN (with an unchanged phase) to the RF output node 14. Accordingly, the amplified and phase-shifted in-phase portion of the RF input signal RF_IN and the amplified quadrature portion of the RF input signal RF_IN each have a phase equal to −90 degrees, and therefore combine to produce an RF output signal RF_OUT equal to the gain of the amplifying devices multiplied by the RF input signal RF_IN at a phase angle of −90 degrees. Further, the quadrature output coupler 28 shifts the quadrature portion of the RF input signal RF_IN by −90 degrees and delivers both the amplified and phase-shifted quadrature portion of the RF input signal RF_IN and the amplified in-phase portion of the RF input signal RF_IN (with an unchanged phase) to the output termination impedance 18. Since the amplified and phase-shifted quadrature portion of the RF input signal RF_IN and the amplified in-phase portion of the RF input signal RF_IN are of equal magnitude and are also 180 degrees out of phase with one another, these signals effectively cancel.

As the load provided at the RF output node 14 changes to become mismatched with the output termination impedance 18, for example, due to a change in the impedance of an antenna connected to the RF output node 14, the balanced amplifier experiences what is known as "load pull" due to a high voltage standing wave ratio (VSWR). Specifically, the magnitude of the amplified in-phase portion of the RF input signal RF_IN and the amplified quadrature portion of the RF input signal RF_IN become mismatched, and therefore the signals no longer cancel at the output termination impedance 18 as discussed above. This results in a buildup of voltage across the output termination impedance 18, which may eventually result in damage to the output termination impedance 18 as well as damage to the first amplifying device 20 and/or second amplifying device 22. Further, this results in thermal stress on the first amplifying device 20 and/or the second amplifying device 22, reduced efficiency, and higher voltage swings at the device terminals.

In an effort to protect the conventional balanced amplifier 10 from damage due to high VSWR conditions, external isolators have been used in conjunction with the output termination impedance 18. FIG. 2 shows the conventional balanced amplifier 10 including an external isolator 44 coupled in series with an additional output termination impedance 45 between the RF output node 14 and ground. The external isolator 44 may be a circulator, which may consume a large amount of area and further add expense to the surrounding circuitry of the conventional balanced amplifier 10. Further, the external isolator 44 may degrade the efficiency of the conventional balanced amplifier 10. As shown in FIG. 2, the conventional balanced amplifier 10 may be integrated onto a semiconductor die, represented by the dashed box 46 shown in FIG. 2. However, the external isolator 44 cannot be integrated onto the semiconductor die 46 due to the size thereof. Accordingly, there is a need for a balanced amplifier that is capable of safely dealing with high VSWR conditions while simultaneously being efficient and compact.

SUMMARY

The present disclosure relates to bias circuitry for balanced amplifiers. In one embodiment, circuitry includes a balanced amplifier and bias adjustment circuitry. The bias adjustment circuitry is coupled to the balanced amplifier and is configured to measure an RF termination voltage across an output termination impedance of the balanced amplifier and adjust a bias voltage supplied to the balanced amplifier based on the RF termination voltage. Notably, the RF termination voltage is proportional to a voltage standing wave ratio (VSWR) of the balanced amplifier, and thus enables an accurate measurement thereof. By using the RF termination voltage to adjust a bias voltage supplied to the balanced amplifier, damage to the balanced amplifier as a result of high VSWR conditions may be avoided while maintaining the performance of the balanced amplifier and adding minimal additional area to the balanced amplifier.

In one embodiment, the balanced amplifier and the bias adjustment circuitry are monolithically integrated on a semiconductor die.

In one embodiment, the bias adjustment circuitry comprises termination voltage amplification circuitry configured to receive and amplify the RF termination voltage and bias adjustment voltage generation circuitry configured to generate a direct current (DC) bias adjustment voltage based on the amplified RF termination voltage.

In one embodiment, the bias adjustment voltage generation circuitry comprises a bias adjustment input node, a bias adjustment output node, a load resistor coupled between the bias adjustment input node and ground, a bias adjustment capacitor coupled between the bias adjustment input node and an intermediary bias adjustment node, a first bias adjustment diode including an anode coupled to the intermediary bias adjustment node and a cathode coupled to ground, a second bias adjustment diode including a cathode coupled to the intermediary bias adjustment node and an anode, a first bias adjustment resistor coupled between the anode of the second bias adjustment diode and the bias adjustment output node, and a second bias adjustment resistor coupled between the bias adjustment output node and a nominal bias voltage input node.

In one embodiment, the termination voltage amplification circuitry comprises a variable gain amplifier.

In one embodiment, the balanced amplifier comprises an RF input node and an RF output node, an input termination impedance and an output termination impedance, a first amplifying device, a second amplifying device, an input quadrature coupler, and an output quadrature coupler. The input quadrature coupler includes a first input node coupled to the input termination impedance, a second input node coupled to the RF input node, a first output node coupled to an input node of the first amplifying device, and a second output node coupled to an input node of the second amplifying device. The output quadrature coupler includes a first input node coupled to an output node of the first amplifying device, a second input node coupled to an output node of the second amplifying device, a first output node coupled to the RF output node, and a second output node coupled to the output termination impedance.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
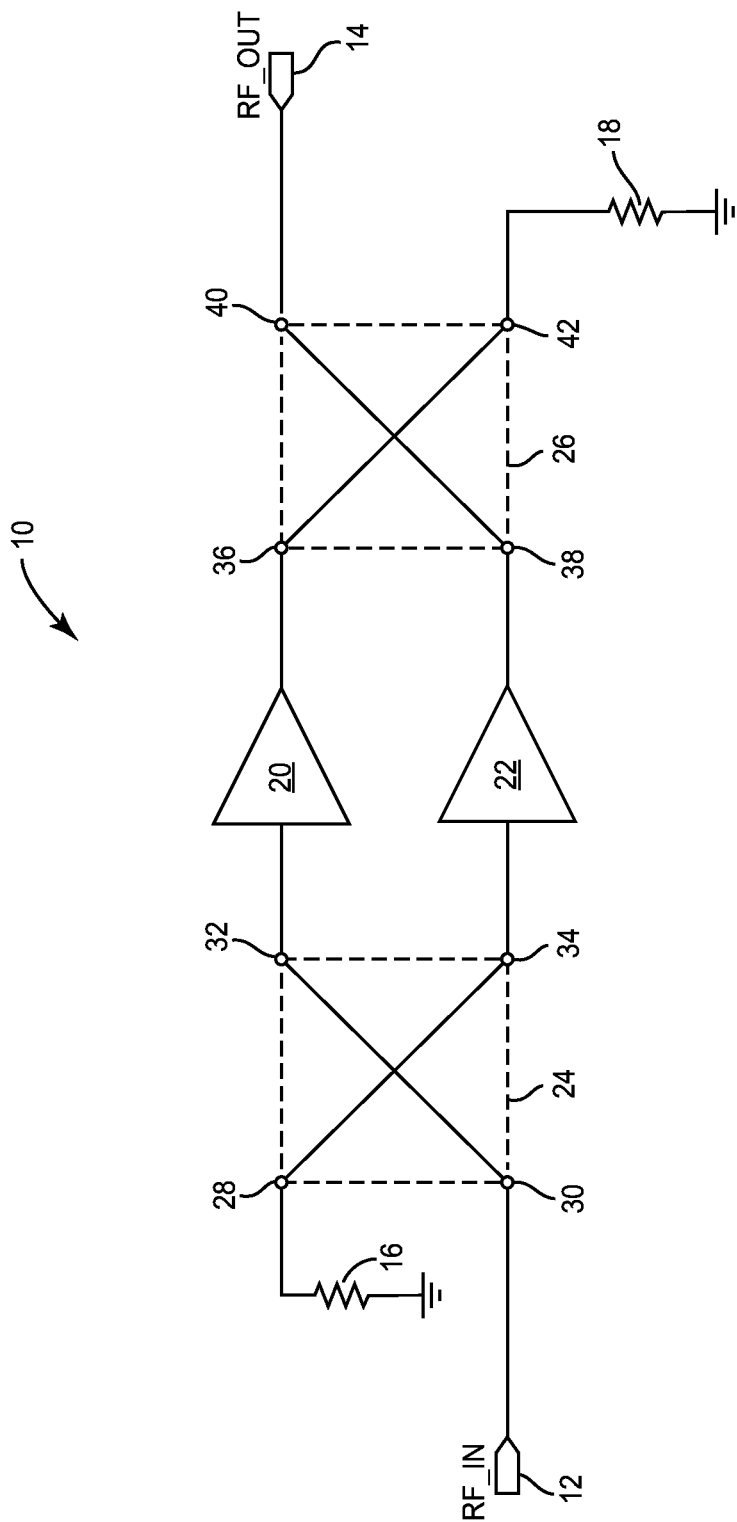
FIG. 1 is a schematic representation of a conventional balanced amplifier.
Figure 2:
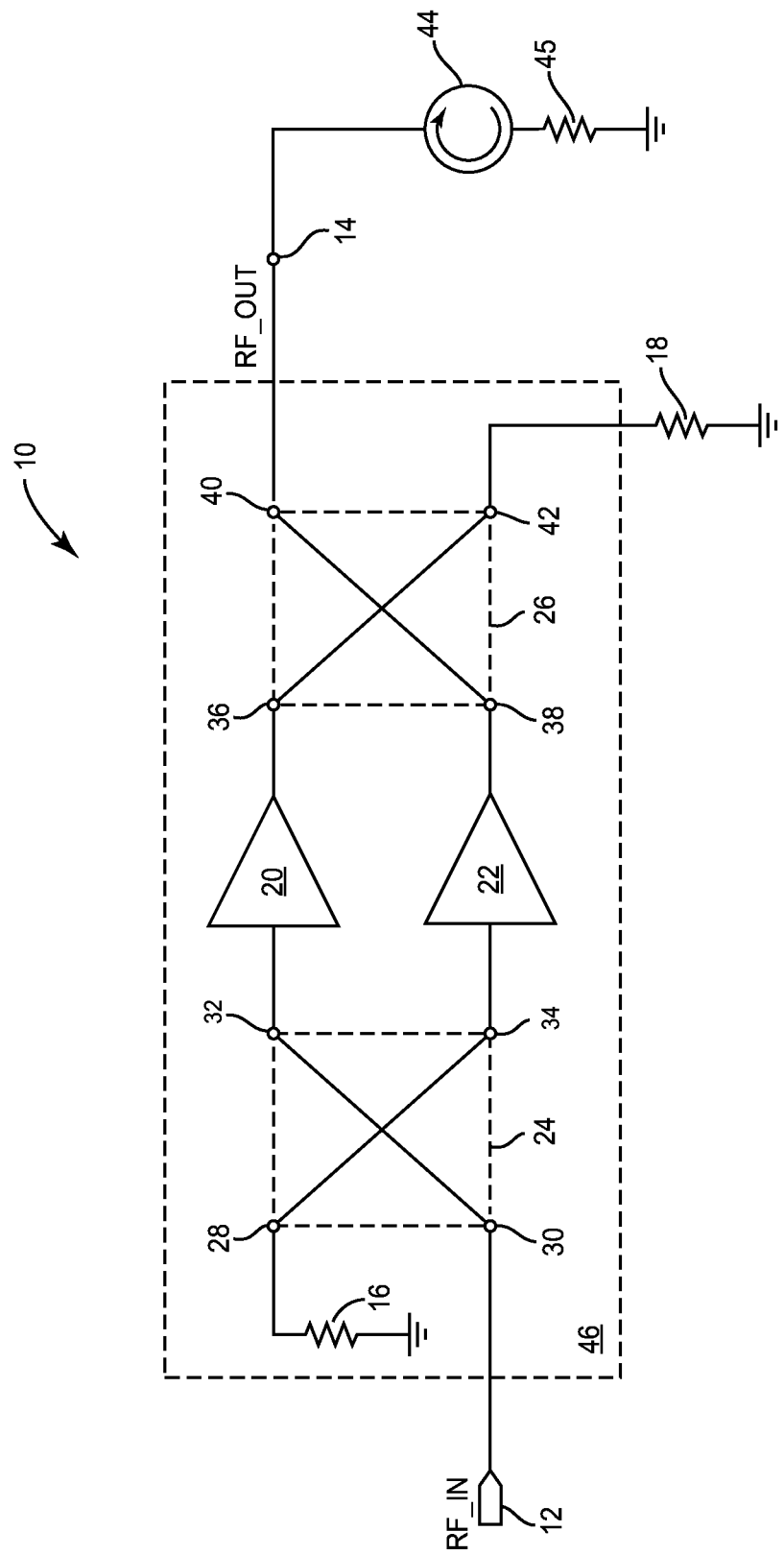
FIG. 2 is a schematic representation of a conventional balanced amplifier including isolation circuitry.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 3:
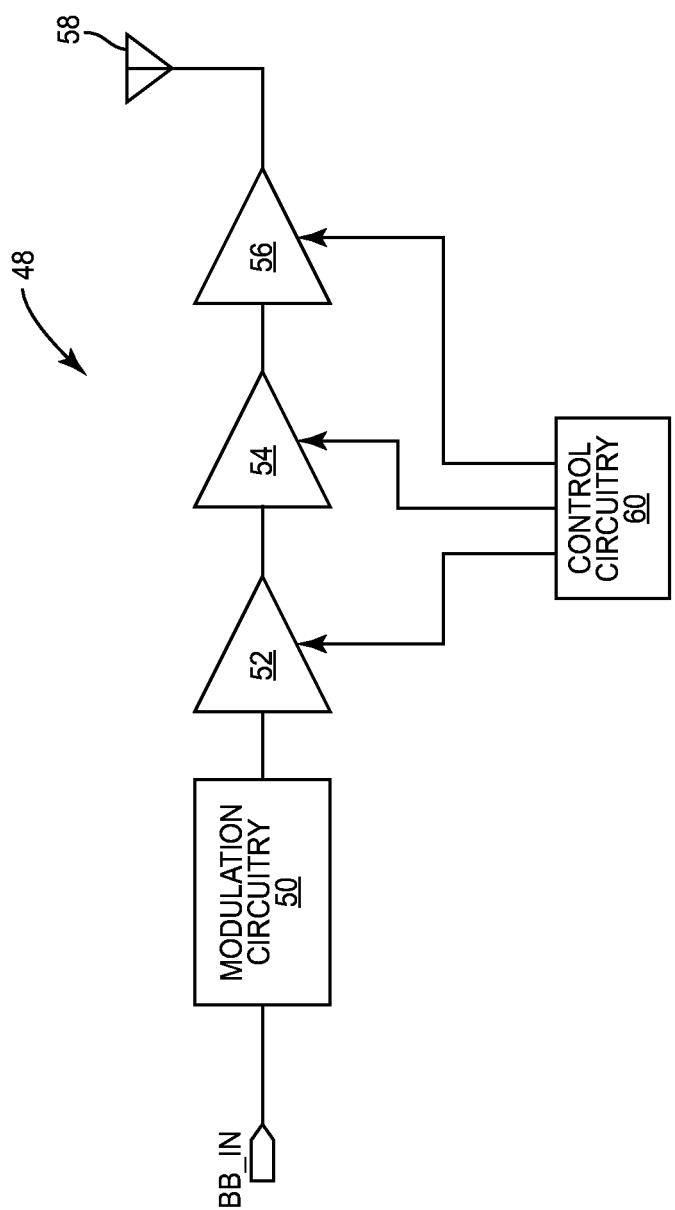
FIG. 3 is a schematic representation of a radio frequency (RF) transmit chain according to one embodiment of the present disclosure.

FIG. 3 shows a radio frequency (RF) transmit chain 48 according to one embodiment of the present disclosure. The RF transmit chain 48 includes modulation circuitry 50, a first driver stage amplifier 52, a second driver stage amplifier 54, a final driver stage amplifier 56, an antenna 58, and control circuitry 60. The modulation circuitry 50 is coupled to an input of the first driver stage amplifier 52. An output of the first driver stage amplifier 52 is coupled to an input of the second driver stage amplifier 54. An output of the second driver stage amplifier 54 is coupled to an input of the final driver stage amplifier 56, the output of which is in turn coupled to the antenna 58. The control circuitry 60 may be connected to one or more of the first driver stage amplifier 52, the second driver stage amplifier 54, and the final driver stage amplifier 56 in order to control the operation thereof. Specifically, the control circuitry 60 may be configured to control the level of a bias voltage delivered to one or more of the first driver stage amplifier 52, the second driver stage amplifier 54, and the final driver stage amplifier 56, and further may be configured to control the level of bias voltage adjustment accomplished by bias adjustment circuitry coupled to one or more of the first driver stage amplifier 52, the second driver stage amplifier 54, and the final driver stage amplifier 56, as will be discussed in further detail below.

In operation, a baseband signal BB_IN is received at the modulation circuitry 50 of the RF transmit chain 48, where it is modulated at a desired carrier frequency and delivered to the first driver stage amplifier 52. The first driver stage amplifier 52 amplifies the modulated baseband signal and delivers the amplified modulated baseband signal to the second driver stage amplifier 54. The second driver stage amplifier 54 once again amplifies the modulated baseband signal and delivers the resulting signal to the final stage amplifier 56. The final driver stage amplifier 56 further amplifies the modulated baseband signal to a level appropriate for transmission from the antenna 58 and delivers the signal to the antenna 58, where the signal is subsequently radiated into the surrounding environment.

Although two driver stage amplifiers and one final stage amplifier are shown in the RF transmit chain 48, any number of driver stages may be used in the RF transmit chain 48 without departing from the principles of the present disclosure. Further, additional components may be included in the RF transmit chain, for example, input matching circuitry, output matching circuitry, etc. may be included in the RF transmit chain 48 without departing from the principles of the present disclosure. Finally, although not explicitly described, the principles of the present disclosure may be extended to additional applications such as RF receive chains including one or more cascaded low noise amplifiers (LNAs), all of which are contemplated herein.

Figure 4:
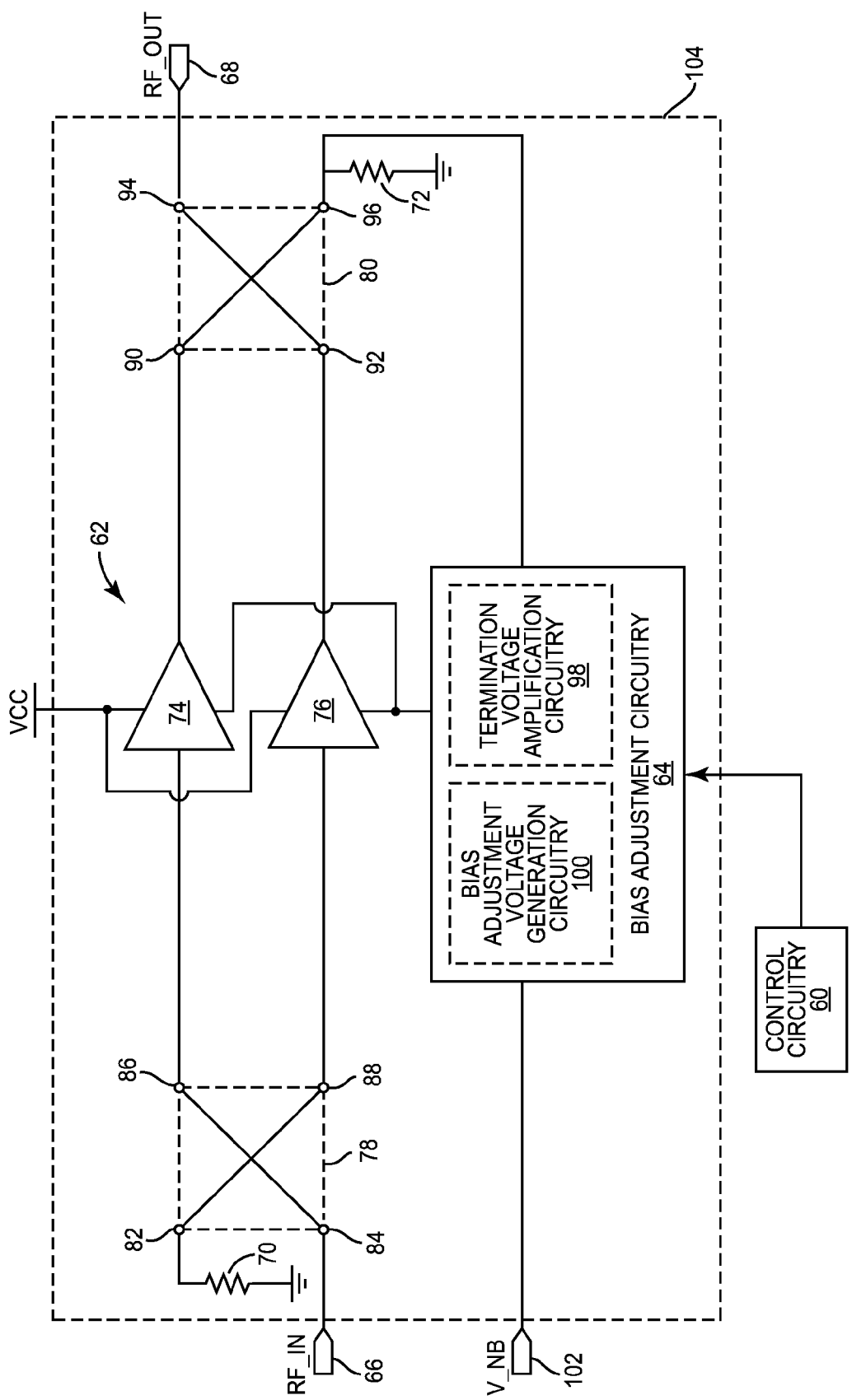
FIG. 4 is a schematic representation of a balanced amplifier including bias adjustment circuitry according to one embodiment of the present disclosure.

FIG. 4 shows a balanced amplifier 62 and accompanying bias adjustment circuitry 64 according to one embodiment of the present disclosure. The balanced amplifier 62 and the bias adjustment circuitry 64 may be used as one or more of the first driver stage amplifier 52, the second driver stage amplifier 54, and the final driver stage amplifier 56 in the RF transmit chain 48 discussed above. The balanced amplifier 62 is substantially similar to that shown above with respect to FIG. 1, such that the balanced amplifier 62 includes an RF input node 66, an RF output node 68, an input termination impedance 70, an output termination impedance 72, a first amplifying device 74, a second amplifying device 76, an input quadrature coupler 78, and an output quadrature coupler 80. The input quadrature coupler 78 includes a first input node 82 coupled to the input termination impedance 70, a second input node 84 coupled to the RF input node 66, a first output node 86 coupled to an input of the first amplifying device 74, and a second output node 88 coupled to an input of the second amplifying device 76. The output quadrature coupler 80 includes a first input node 90 coupled to an output of the first amplifying device 74, a second input node 92 coupled to an output of the second amplifying device 76, a first output node 94 coupled to the RF output node 68, and a second output node 96 coupled to the output termination impedance 72.

The bias adjustment circuitry 64 includes termination voltage amplification circuitry 98 and bias adjustment voltage generation circuitry 100. The termination voltage amplification circuitry 98 is coupled to the second output node 96 of the output quadrature coupler 80, such that the termination voltage amplification circuitry 98 is configured to receive and amplify the voltage across the output termination impedance 72, which is herein referred to throughout as the "RF termination voltage." The bias adjustment voltage generation circuitry 100 is coupled to an output of the termination voltage amplification circuitry 98, such that the bias adjustment voltage generation circuitry 100 is configured to receive an amplified version of the RF termination voltage. The bias adjustment voltage generation circuitry 100 is further coupled to a nominal bias voltage input node 102, such that the bias adjustment voltage generation circuitry 100 is configured to receive a nominal bias voltage V_NB. Finally, the bias adjustment voltage generation circuitry 100 is coupled to each one of the first amplifying device 74 and the second amplifying device 76. Accordingly, the bias adjustment voltage generation circuitry 100 is configured to generate a direct current (DC) bias adjustment voltage based on the amplified RF termination voltage, and deliver the bias adjustment voltage to each one of the first amplifying device 74 and the second amplifying device 76. The control circuitry 60 may be coupled to the termination voltage amplification circuitry 98, the bias adjustment voltage generation circuitry 100, or both, in order to control one or more parameters of the bias adjustment circuitry 64, as discussed in further detail below.

As discussed above, as the voltage standing wave ratio (VSWR) of the balanced amplifier 62 increases, due to, for example, a changing impedance of an antenna coupled to the RF output node 68, a proportional RF termination voltage builds across the output termination impedance 72. Notably, the bias adjustment circuitry 64 utilizes this proportional relationship of the VSWR of the balanced amplifier 62 to that of the RF termination voltage in order to adjust a bias voltage of the first amplifying device 74 and the second amplifying device 76 and thereby protect the first amplifying device 74 and the second amplifying device 76 in the event of a high VSWR condition. Specifically, when the RF termination voltage measured across the output termination impedance 72 is above a predetermined threshold, the bias adjustment voltage generation circuitry 100 generates a bias adjustment voltage sufficient to turn the first amplifying device 74 and the second amplifying device 76 off, thereby protecting the first amplifying device 74 and the second amplifying device 76 from damage due to high VSWR conditions. Measuring the VSWR of the balanced amplifier 62 using the RF termination voltage is achieved practically for free, as it impacts the operation of the balanced amplifier 62 minimally, if at all.

In one embodiment, the balanced amplifier 62 and the bias adjustment circuitry 64 are monolithically integrated on a semiconductor die. An exemplary semiconductor die is shown as the dashed box 104 shown in FIG. 4. As discussed in further detail below, the design of the bias adjustment circuitry 64 is such that it can be integrated onto a relatively small area of a semiconductor die at a low cost, thereby saving valuable area in a device incorporating the balanced amplifier 62 and bias adjustment circuitry 64.

Figure 5:
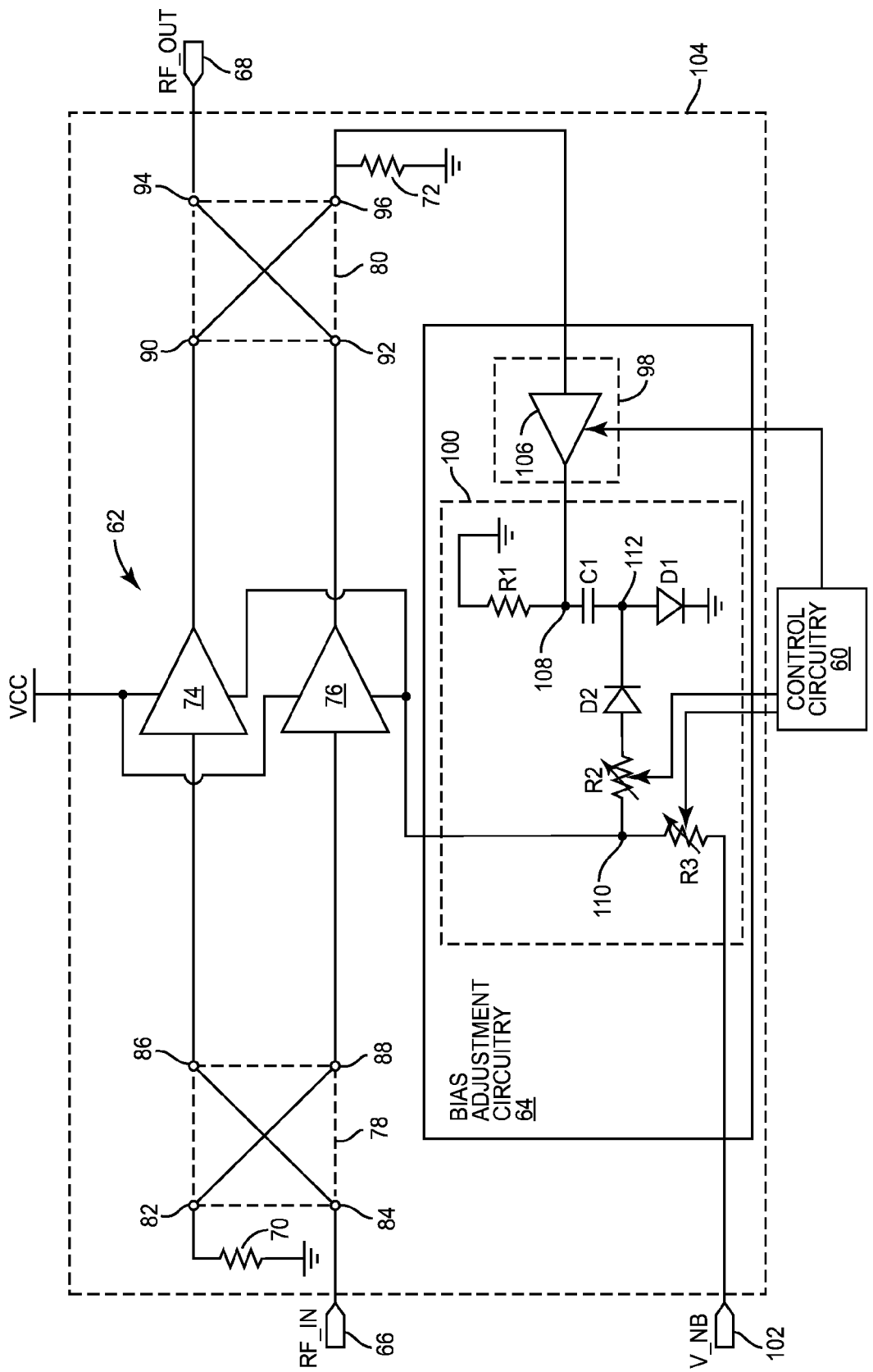
FIG. 5 is a schematic representation of a balanced amplifier including bias adjustment circuitry according to an additional embodiment of the present disclosure.

FIG. 5 shows details of the termination voltage amplification circuitry 98 and the bias adjustment voltage generation circuitry 100 according to one embodiment of the present disclosure. The termination voltage amplification circuitry 98 includes a variable gain amplifier 106. The variable gain amplifier 106 may receive and amplify the RF termination voltage across the output termination impedance 72 such that the resulting signal is suitable for processing by the bias adjustment voltage generation circuitry 100. Notably, the input impedance of the variable gain amplifier 106 may be exceptionally high in order to mitigate the effect of the bias adjustment circuitry 64 on the functionality of the balanced amplifier 62. Further, the variable gain amplifier 106 may be coupled to the control circuitry 60, such that the control circuitry 60 is capable of adjusting the gain of the variable gain amplifier 106. Adjusting the gain of the variable gain amplifier 106 results in an increase or decrease in the predetermined threshold at which the bias adjustment circuitry 64 turns off the first amplifying device 74 and the second amplifying device 76. Accordingly, the control circuitry 60 may adjust the sensitivity of the bias adjustment circuitry 64 to the VSWR of the balanced amplifier 62.

The bias adjustment voltage generation circuitry 100 includes a bias adjustment input node 108, a bias adjustment output node 110, an intermediary bias adjustment node 112, a load resistor R1, a first bias adjustment resistor R2, a second bias adjustment resistor R3, a first bias adjustment capacitor C1, a first bias adjustment diode D1, and a second bias adjustment diode D2. The load resistor R1 is coupled between the bias adjustment input node 108 and ground. The first bias adjustment capacitor C1 is coupled between the bias adjustment input node 108 and the intermediary bias adjustment node 112. The first bias adjustment diode D1 includes an anode coupled to the intermediary bias adjustment node 112 and a cathode coupled to ground. The second bias adjustment diode D2 includes a cathode coupled to the intermediary bias adjustment node 112 and an anode. The first bias adjustment resistor R2 is coupled between the anode of the second bias adjustment diode D2 and the bias adjustment output node 110, and the second bias adjustment resistor R3 is coupled between the nominal bias voltage input node 102 and the bias adjustment output node 110. Finally, the bias adjustment output node 110 is connected to the input of each one of the first amplifying device 74 and the second amplifying device 76.

In operation, when the amplified RF termination voltage provided by the termination voltage amplification circuitry 98 is below a predetermined threshold, a voltage sampled across the first bias adjustment capacitor C1 is insufficient to place the first bias adjustment diode D1 into a forward conduction mode of operation. Accordingly, the compact rectification circuit formed by the first bias adjustment diode D1, the second bias adjustment diode D2, the first bias adjustment resistor R2, and the second bias adjustment resistor R3 is turned off. A nominal bias voltage provided at the nominal bias voltage input node 102 is thus provided as a bias adjustment voltage through the second bias adjustment resistor R3 to the first amplifying device 74 and the second amplifying device 76. Notably, the first amplifying device 74 and the second amplifying device 76 are configured such that they are active (i.e., conducting) when they receive the nominal bias voltage.

When the amplified RF termination voltage is raised above the threshold voltage of the first bias adjustment diode D1, the compact rectification circuit formed by the first bias adjustment diode D1, the second bias adjustment diode D2, the first bias adjustment resistor R2 and the second bias adjustment resistor R3 is turned on, and thus produces an average or DC current ($I_{DC}$), which flows from the nominal bias voltage input node 102 to ground through the second bias adjustment resistor R3, the first bias adjustment resistor R2, the second bias adjustment diode D2, and the first bias adjustment diode D1. This in turn reduces the nominal bias voltage at each one of the first amplifying device 74 and the second amplifying device 76 and begins to turn off the first amplifying device 74 and the second amplifying device 76.

As discussed above, the RF termination voltage is proportional to the VSWR experienced by the balanced amplifier 62. Accordingly, the bias adjustment circuitry 64 is configured to adjust the bias voltage to the first amplifying device 74 and the second amplifying device 76 based on the VSWR of the balanced amplifier 62, turning off the first amplifying device 74 and the second amplifying device 76 when the VSWR experienced by the balanced amplifier 62 is above a predetermined threshold. Turning off the balanced amplifier 62 during high VSWR conditions effectively protects the first amplifying device 74 and the second amplifying device 76 from high power dissipation and thus breakdown conditions, thereby increasing the reliability of the balanced amplifier 62 and reducing the risk of failure. When the high VSWR condition subsides, the RF termination voltage is reduced, thereby turning off the compact rectification circuit and restoring the bias voltage provided to the first amplifying device 74 and the second amplifying device 76 to its nominal value. Accordingly, the first amplifying device 74 and the second amplifying device 76 are placed into an active mode of operation (i.e., conducting), thereby restoring the balanced amplifier 62 to its normal state of operation.

In one embodiment, the first bias adjustment resistor R2 and the second bias adjustment resistor R3 are adjustable. Further, the first bias adjustment resistor R2 and the second bias adjustment resistor R3 may be connected to the control circuitry 60 such that the control circuitry 60 can adjust the resistance of the first bias adjustment resistor R2 and the second bias adjustment resistor R3. Accordingly, an additional way for the control circuitry 60 to adjust the sensitivity of the bias adjustment circuitry 64 to the VSWR of the balanced amplifier 62 is provided. Although the control circuitry 60 is shown separately from the bias adjustment circuitry 64 and off the semiconductor die 104, the control circuitry 60 may be part of the bias adjustment circuitry 64 and integrated onto the semiconductor die 104 in some embodiments.

Figure 6:
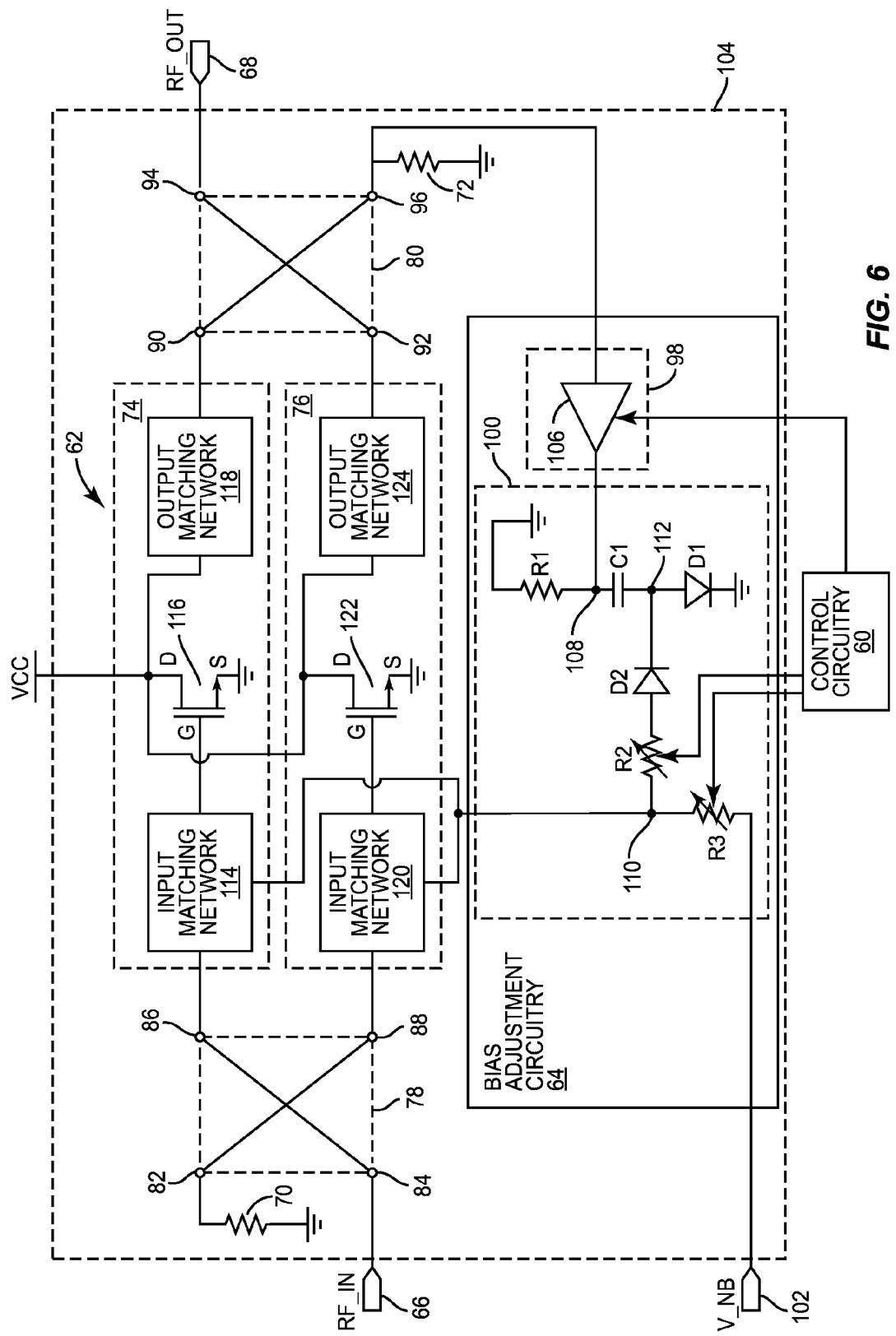
FIG. 6 is a schematic representation of a balanced amplifier including bias adjustment circuitry according to an additional embodiment of the present disclosure.

FIG. 6 shows details of the first amplifying device 74 and the second amplifying device 76 according to one embodiment of the present disclosure. The first amplifying device 74 includes a first input matching network 114, a first amplifying transistor 116, and a first output matching network 118. The first input matching network 114 is connected to a gate contact (G) of the first amplifying transistor 116. The first output matching network 118 is connected to a drain contact (D) of the first amplifying transistor 116, which is in turn connected to a supply voltage $V_{CC}$. A source contact (S) of the first amplifying transistor 116 is coupled to ground. Similarly, the second amplifying device 76 includes a second input matching network 120, a second amplifying transistor 122, and a second output matching network 124. The second input matching network 120 is coupled to a gate contact (G) of the second amplifying transistor 122. The second output matching network 124 is coupled to a drain contact (D) of the second amplifying transistor 122, which is in turn coupled to the supply voltage $V_{CC}$. A source contact (S) of the second amplifying transistor 122 is coupled to ground.

The quadrature portion of the RF input signal RF_IN is delivered to the first input matching network 114 along with the bias adjustment voltage. The quadrature portion of the RF input signal RF_IN from the first output node 86 of the input quadrature coupler 78 and the bias adjustment voltage from the bias adjustment circuitry 64 are separately delivered to the first input matching network 114 and combined through one or more matching components such that the gate contact (G) of the first amplifying transistor 116 receives a combination of the two signals. Similarly, the in-phase portion of the RF input signal RF_IN from the second output node 88 of the input quadrature coupler 78 and the bias adjustment voltage from the bias adjustment circuitry 64 are separately delivered to the second input matching network 120 such that the gate contact (G) of the second amplifying transistor 122 receives a combination of the two signals.

The first amplifying transistor 116 and the second amplifying transistor 122 may be field-effect transistor (FET) devices. For example, the first amplifying transistor 116 and the second amplifying transistor 122 may be metal-oxide semiconductor field-effect transistors (MOSFETs). In other embodiments, the first amplifying transistor 116 and the second amplifying transistor 122 may be high electron mobility transistors (HEMTs), bipolar junction transistors (BJTs), insulated gate bipolar transistors (IGBTs), or the like. The particular configuration of the first input matching network 114, the first output matching network 118, the second input matching network 120, and the second output matching network 124 may vary substantially between embodiments. In general, any suitable impedance matching network may be used for the first input matching network 114, the first output matching network 118, the second input matching network 120, and the second output matching network 124.

Those skilled in the art will recognize improvements and modifications to the preferred embodiments of the present disclosure. All such improvements and modifications are considered within the scope of the concepts disclosed herein and the claims that follow.

What is claimed is:

1. Circuitry comprising:
   a balanced amplifier comprising:
      an input quadrature coupler;
      an output quadrature coupler; and
      a first amplifying element and a second amplifying element coupled between the input quadrature coupler and the output quadrature coupler; and
   bias adjustment circuitry coupled to the balanced amplifier and configured to:
      measure an RF termination voltage across an output termination impedance coupled to the output quadrature coupler of the balanced amplifier, wherein the RF termination voltage is proportional to a voltage standing wave ratio (VSWR) of the balanced amplifier; and
      adjust a bias voltage supplied to the balanced amplifier based on the RF termination voltage.

2. The circuitry of claim 1 wherein the balanced amplifier and the bias adjustment circuitry are monolithically integrated on a semiconductor die.

3. The circuitry of claim 1 wherein the bias adjustment circuitry comprises:
   termination voltage amplification circuitry configured to receive and amplify the RF termination voltage; and
   bias adjustment voltage generation circuitry configured to generate a direct current (DC) bias adjustment voltage based on the amplified RF termination voltage.

4. The circuitry of claim 3 wherein the bias adjustment voltage generation circuitry comprises:
   a bias adjustment input node and a bias adjustment output node;
   a load resistor coupled between the bias adjustment input node and ground;
   a bias adjustment capacitor coupled between the bias adjustment input node and an intermediary bias adjustment node;
   a first bias adjustment diode including an anode coupled to the intermediary bias adjustment node and a cathode coupled to ground;
   a second bias adjustment diode including a cathode coupled to the intermediary bias adjustment node and an anode;
   a first bias adjustment resistor coupled between the anode of the second bias adjustment diode and the bias adjustment output node; and
   a second bias adjustment resistor coupled between the bias adjustment output node and a nominal bias voltage input node.

5. The circuitry of claim 4 wherein the termination voltage amplification circuitry comprises a variable gain amplifier.

6. The circuitry of claim 3 wherein the balanced amplifier comprises:
   an RF input node and an RF output node;
   an input termination impedance and the output termination impedance;
   a first amplifying device;
   a second amplifying device;
   the input quadrature coupler including a first input node coupled to the input termination impedance, a second input node coupled to the RF input node, a first output node coupled to an input node of the first amplifying device, and a second output node coupled to an input node of the second amplifying device; and
   the output quadrature coupler including a first input node coupled to an output node of the first amplifying device, a second input node coupled to an output node of the second amplifying device, a first output node coupled to the RF output node, and a second output node coupled to the output termination impedance.

7. The circuitry of claim 6 wherein the bias adjustment voltage generation circuitry comprises:
a bias adjustment input node and a bias adjustment output node;
a load resistor coupled between the bias adjustment input node and ground;
a bias adjustment capacitor coupled between the bias adjustment input node and an intermediary bias adjustment node;
a first bias adjustment diode including an anode coupled to the intermediary bias adjustment node and a cathode coupled to ground;
a second bias adjustment diode including a cathode coupled to the intermediary bias adjustment node and an anode;
a first bias adjustment resistor coupled between the anode of the second bias adjustment diode and the bias adjustment output node; and
a second bias adjustment resistor coupled between the bias adjustment output node and a nominal bias voltage input node.

8. The circuitry of claim 6 wherein each one of the first amplifying device and the second amplifying device comprise:
an input node and an output node;
an input matching network;
an output matching network; and
a field effect transistor (FET) coupled between the input matching network and the output matching network.

9. The circuitry of claim 8 wherein:
the input matching network is coupled between the input node and a gate contact of the FET;
the output matching network is coupled between a drain contact of the FET and the output node; and
a source contact of the FET is coupled to ground.

10. The circuitry of claim 1 wherein the balanced amplifier comprises:
an RF input node and an RF output node;
an input termination impedance and the output termination impedance;
a first amplifying device;
a second amplifying device;
the input quadrature coupler including a first input node coupled to the input termination impedance, a second input node coupled to the RF input node, a first output node coupled to an input node of the first amplifying device, and a second output node coupled to an input node of the second amplifying device; and
the output quadrature coupler including a first input node coupled to an output node of the first amplifying device, a second input node coupled to an output node of the second amplifying device, a first output node coupled to the RF output node, and a second output node coupled to the output termination impedance.

11. The circuitry of claim 10 wherein each one of the first amplifying device and the second amplifying device comprise:
an input node and an output node;
an input matching network;
an output matching network; and
a field effect transistor (FET) coupled between the input matching network and the output matching network.

12. The circuitry of claim 11 wherein:
the input matching network is coupled between the input node and a gate contact of the FET;
the output matching network is coupled between a drain contact of the FET and the output node; and
a source contact of the FET is coupled to ground.

13. A radio frequency transmit chain comprising:
one or more driver stages; and
a final stage comprising:
a balanced amplifier comprising:
an input quadrature coupler;
an output quadrature coupler; and
a first amplifying element and a second amplifying element coupled between the input quadrature coupler and the output quadrature coupler; and
bias adjustment circuitry coupled to the balanced amplifier and configured to:
measure an RF termination voltage across an output termination impedance coupled to the output quadrature coupler of the balanced amplifier, wherein the RF termination voltage is proportional to a voltage standing wave ratio (VSWR) of the balanced amplifier; and
adjust a bias voltage supplied to the balanced amplifier based on the RF termination voltage.

14. The radio frequency transmit chain of claim 13 wherein the balanced amplifier and the bias adjustment circuitry are monolithically integrated on a semiconductor die.

15. The radio frequency transmit chain of claim 13 wherein the bias adjustment circuitry comprises:
termination voltage amplification circuitry configured to receive and amplify the RF termination voltage; and
bias adjustment voltage generation circuitry configured to generate a direct current (DC) bias adjustment voltage based on the amplified RF termination voltage.

16. The radio frequency transmit chain of claim 15 wherein the bias adjustment voltage generation circuitry comprises:
a bias adjustment input node and a bias adjustment output node;
a load resistor coupled between the bias adjustment input node and ground;
a bias adjustment capacitor coupled between the bias adjustment input node and an intermediary bias adjustment node;
a first bias adjustment diode including an anode coupled to the intermediary bias adjustment node and a cathode coupled to ground;
a second bias adjustment diode including a cathode coupled to the intermediary bias adjustment node and an anode;
a first bias adjustment resistor coupled between the anode of the second bias adjustment diode and the bias adjustment output node; and
a second bias adjustment resistor coupled between the bias adjustment output node and a nominal bias voltage input node.

17. The radio frequency transmit chain of claim 16 wherein the termination voltage amplification circuitry comprises a variable gain amplifier.

18. The radio frequency transmit chain of claim 15 wherein the balanced amplifier comprises:
an RF input node and an RF output node;
an input termination impedance and the output termination impedance;
a first amplifying device;
a second amplifying device;
the input quadrature coupler including a first input node coupled to the input termination impedance, a second input node coupled to the RF input node, a first output node coupled to an input node of the first amplifying device, and a second output node coupled to an input node of the second amplifying device; and the output quadrature coupler including a first input node coupled to an output node of the first amplifying device, a second input node coupled to an output node of the second amplifying device, a first output node coupled to the RF output node, and a second output node coupled to the output termination impedance.

19. The radio frequency transmit chain of claim 18 wherein the bias adjustment voltage generation circuitry comprises:

a bias adjustment input node and a bias adjustment output node;

a load resistor coupled between the bias adjustment input node and ground;

a bias adjustment capacitor coupled between the bias adjustment input node and an intermediary bias adjustment node;

a first bias adjustment diode including an anode coupled to the intermediary bias adjustment node and a cathode coupled to ground;

a second bias adjustment diode including a cathode coupled to the intermediary bias adjustment node and an anode;

a first bias adjustment resistor coupled between the anode of the second bias adjustment diode and the bias adjustment output node; and a second bias adjustment resistor coupled between the bias adjustment output node and a nominal bias voltage input node.

20. The radio frequency transmit chain of claim 18 wherein each one of the first amplifying device and the second amplifying device comprise:

an input node and an output node;
an input matching network;
an output matching network; and
a field effect transistor (FET) coupled between the input matching network and the output matching network.

21. The radio frequency transmit chain of claim 20 wherein:

the input matching network is coupled between the input node and a gate contact of the FET;

the output matching network is coupled between a drain contact of the FET and the output node; and a source contact of the FET is coupled to ground.

22. The radio frequency transmit chain of claim 13 wherein the balanced amplifier comprises:

an RF input node and an RF output node;

an input termination impedance and the output termination impedance;

a first amplifying device;

a second amplifying device;

the input quadrature coupler including a first input node coupled to the input termination impedance, a second input node coupled to the RF input node, a first output node coupled to an input node of the first amplifying device, and a second output node coupled to an input node of the second amplifying device; and the output quadrature coupler including a first input node coupled to an output node of the first amplifying device, a second input node coupled to an output node of the second amplifying device, a first output node coupled to the RF output node, and a second output node coupled to the output termination impedance.

23. The radio frequency transmit chain of claim 22 wherein each one of the first amplifying device and the second amplifying device comprise:

an input node and an output node;
an input matching network;
an output matching network; and
a field effect transistor (FET) coupled between the input matching network and the output matching network.

24. The radio frequency transmit chain of claim 23 wherein:

the input matching network is coupled between the input node and a gate contact of the FET;

the output matching network is coupled between a drain contact of the FET and the output node; and a source contact of the FET is coupled to ground.

* * * * *